US012712596B2

(12) United States Patent
Kwon et al.

(10) Patent No.: US 12,712,596 B2
(45) Date of Patent: Aug. 18, 2026

(54) SHORT-RANGE WIRELESS COMMUNICATION DEVICE PROVIDING RESONANT FREQUENCY DETECTION FUNCTION AND METHOD OF OPERATING THE SAME

(71) Applicant: Samsung Electronics Co., Ltd., Suwon-si (KR)

(72) Inventors: Nyeongmin Kwon, Suwon-si (KR); Seokyeong Kwon, Suwon-si (KR); Seok-Hyun Kim, Suwon-si (KR)

(73) Assignee: Samsung Electronics Co., LTD., Gyeonnggi-Do (KR)

( * ) Notice: Subject to any disclaimer, the term of this patent is extended or adjusted under 35 U.S.C. 154(b) by 283 days.

(21) Appl. No.: 18/470,751

(22) Filed: Sep. 20, 2023

(65) Prior Publication Data

US 2024/0291518 A1 Aug. 29, 2024

(30) Foreign Application Priority Data

Feb. 28, 2023 (KR) ........................ 10-2023-0027324

(51) Int. Cl.
*H04B 5/77* (2024.01)
*H03H 7/38* (2006.01)

(52) U.S. Cl.
CPC ................. *H04B 5/77* (2024.01); *H03H 7/38* (2013.01)

(58) Field of Classification Search
CPC . H04B 5/77; H04B 5/40; H04B 17/00; H04B 5/72
See application file for complete search history.

(56) References Cited

U.S. PATENT DOCUMENTS

| | | | | |
|---|---|---|---|---|
| 7,561,865 | B2 | 7/2009 | Zhang et al. | |
| 11,411,610 | B2 | 8/2022 | Kim et al. | |
| 2002/0068528 | A1 * | 6/2002 | White | G06K 7/10336 379/55.1 |
| 2014/0256270 | A1 | 9/2014 | Cho et al. | |
| 2016/0329638 | A1 | 11/2016 | Kanno | |
| 2019/0074776 | A1 | 3/2019 | Tian | |
| 2020/0169300 | A1 * | 5/2020 | Moon | H03L 7/0814 |

FOREIGN PATENT DOCUMENTS

| | | | |
|---|---|---|---|
| JP | 5883890 | B2 | 3/2016 |
| KR | 10-2020-0062860 | A | 6/2020 |

* cited by examiner

*Primary Examiner* — Ayodeji O Ayotunde
(74) *Attorney, Agent, or Firm* — Harness, Dickey & Pierce, P.L.C.

(57) ABSTRACT

A short-range wireless communication device includes an impedance matching circuit configured to output a radio frequency (RF) signal in a turn-on period, the RF signal being based on a reference clock signal, and output a sensing signal in a turn-off period, and processing circuitry configured to extract a recovered clock signal from the sensing signal, detect a phase difference between the recovered clock signal and the reference clock signal, and detect a resonant frequency of the impedance matching circuit based on the phase difference.

20 Claims, 7 Drawing Sheets

FIG. 11

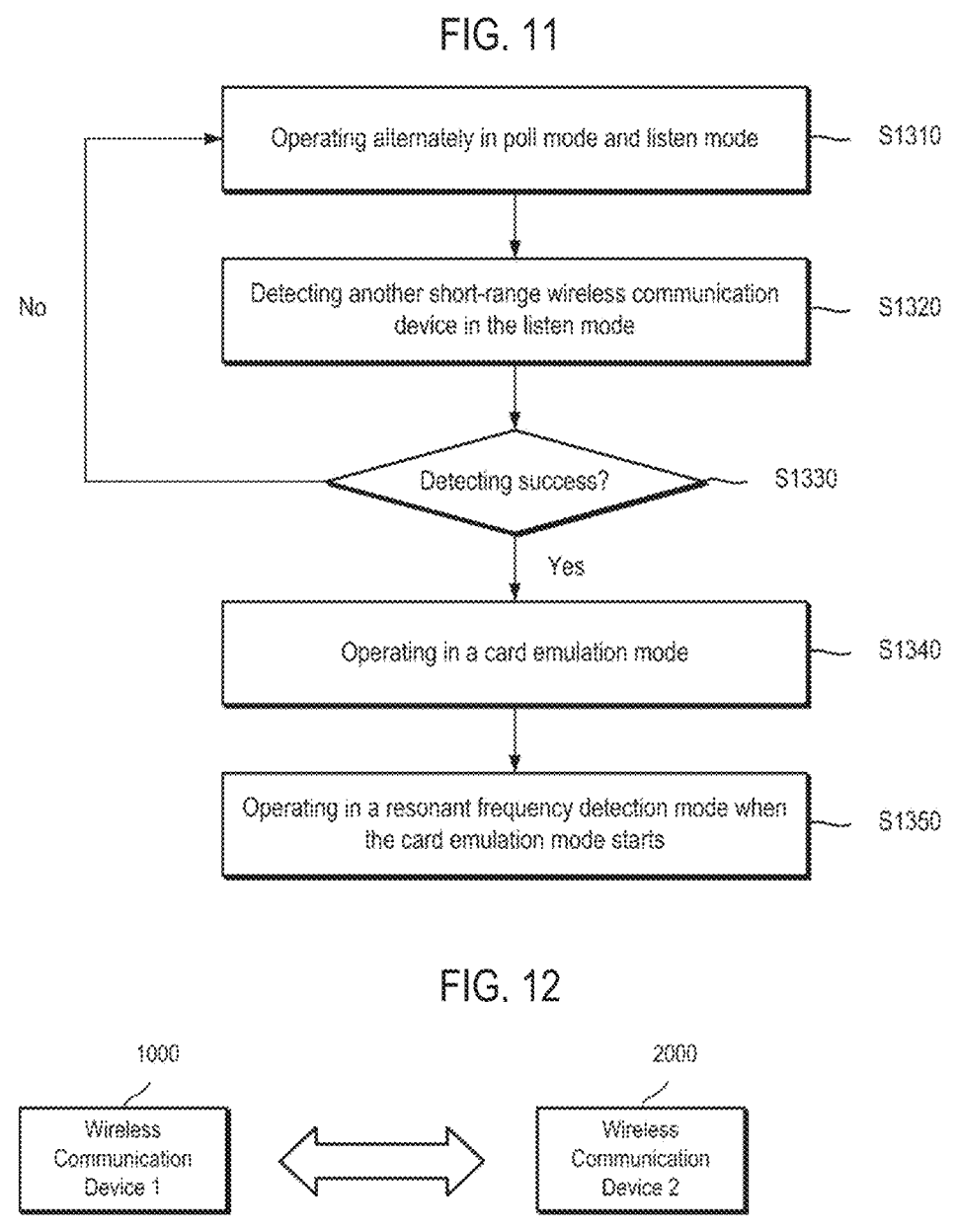

Operating alternately in poll mode and listen mode — S1310

Detecting another short-range wireless communication device in the listen mode — S1320

Detecting success? — S1330

No

Yes

Operating in a card emulation mode — S1340

Operating in a resonant frequency detection mode when the card emulation mode starts — S1350

Wireless Communication Device 1

2000

Wireless Communication Device 2

SHORT-RANGE WIRELESS COMMUNICATION DEVICE PROVIDING RESONANT FREQUENCY DETECTION FUNCTION AND METHOD OF OPERATING THE SAME

CROSS-REFERENCE TO RELATED APPLICATION(S)

This application claims the benefit of priority to Korean Patent Application No. 10-2023-0027324, filed on Feb. 28, 2023, in the Korean Intellectual Property Office, the disclosure of which is incorporated herein by reference in its entirety.

BACKGROUND

The present disclosure relates to a short-range wireless communication device providing a resonant frequency detection function and a method of operating the same.

With the recent development of short-range wireless communication technology, a type of wireless communication technology, short-range wireless communication devices have been widely applied to mobile devices, or the like. A resonant frequency of a short-range wireless communication device may be determined by a combination of various radio-frequency (RF) components, such as an impedance matching circuit, included in the short-range wireless communication device, and may have a distribution due to a characteristic error of each of the RF components. A resonant frequency has a characteristic in which the quality of a signal is improved in a direction toward a center frequency and is distorted in a direction away from the center frequency. Accordingly, when the frequency is determined, the frequency may be used to correct a distortion.

Alternatively, several technologies for detecting a resonant frequency have been proposed to detect a resonant frequency of short-range wireless communication for various other reasons. However, technologies for detecting a resonant frequency according to the related arts suffer from excessive delay in detecting the resonant frequency.

SUMMARY

Example embodiments provide a short-range wireless communication device providing a resonant frequency detection function, allowing detection time to be significantly reduced, and a method of operating the same According to example embodiments, a short-range wireless communication device includes an impedance matching circuit configured to output a radio frequency (RF) signal in a turn-on period, the RF signal being based on a reference clock signal, and output a sensing signal in a turn-off period, and processing circuitry configured to extract a recovered clock signal from the sensing signal, detect a phase difference between the recovered clock signal and the reference clock signal, and detect a resonant frequency of the impedance matching circuit based on the phase difference.

According to example embodiments, a method of operating a short-range wireless communication device includes transmitting a radio frequency (RF) signal in a turn-on period, the RF signal being based on a reference clock signal, extracting a recovered clock signal from a sensing signal output in a turn-off period, detecting a phase difference between the recovered clock signal and the reference clock signal, and detecting a resonant frequency of the short-range wireless communication device based on the phase difference.

According to example embodiments, a method of operating a short-range wireless communication device includes operating alternately in a poll mode and a listen mode, detecting another short-range wireless communication device in the listen mode, operating in a card emulation mode based on the other short-range wireless communication device detecting, and operating in a resonant frequency detection mode when the card emulation mode starts.

BRIEF DESCRIPTION OF DRAWINGS

The above and other aspects, features, and advantages of the present disclosure will be more clearly understood from the following detailed description, taken in conjunction with the accompanying drawings.

FIG. 11 is a flowchart illustrating a method of operating a short-range wireless communication device according to example embodiments.

FIG. 12 is a diagram illustrating a short-range wireless communication system according to example embodiments.

DETAILED DESCRIPTION

Hereinafter, example embodiments will be described with reference to the accompanying drawings.

Hereinafter, example embodiments will be described with reference to the accompanying drawings. In the descriptions below, terms “upper,” “upper portion,” “upper surface,” “lower,” “lower portion,” “lower surface,” “side surface,” and the like, are used with reference to the diagrams unless otherwise indicated.

According to example embodiments, a short-range wireless communication device may alternately, and repeatedly, perform an operation of detecting whether another short-range wireless communication device, for example, a near field communication (NFC) tag, is present nearby and an operation of detecting whether an NFC reader is present nearby. A short-range wireless communication device may perform communication by operating in a card emulation mode when an NFC reader is detected and operating in a reader mode when an NFC card is detected. In this case, a short-range wireless communication device initiating the communication may be referred to as an initiator (or a reader), and a short-range wireless communication device corresponding to the initiator may be referred to as a target (or a tag).

A short-range wireless communication device may transmit and receive data to and from another short-range wireless communication device based on passive load modulation (PLM) or active load modulation (ALM).

In the case of PLM, switching of a load connected to an antenna of a target may be performed, and the switched load may correspond to a modulated state. When antennas of an initiator and the target are inductively coupled to each other, the initiator may detect a change in the load and decode a signal to obtain information. A difference between a modulated voltage detected by the initiator and an unmodulated voltage is a load modulation amplitude. In the PLM, a target may modulate a load in response to an RF field generated in the target.

Unlike the PLM, in the ALM, the initiator or the target may actively transmit a modulated signal. In the ALM, a modulated signal synchronized with a carrier signal may be transmitted during a modulated state and may be turned off during an unmodulated state. In the ALM, the target may transmit a load modulation signal using only internal power thereof without depending on an external power supply. As compared with the PLM, the ALM is advantageous in securing communication performance may be secured even when a target antenna has a small size. Hereinafter, example embodiments will be described with respect to a short-range wireless communication device performing communication based on ALM.

Figure 1:
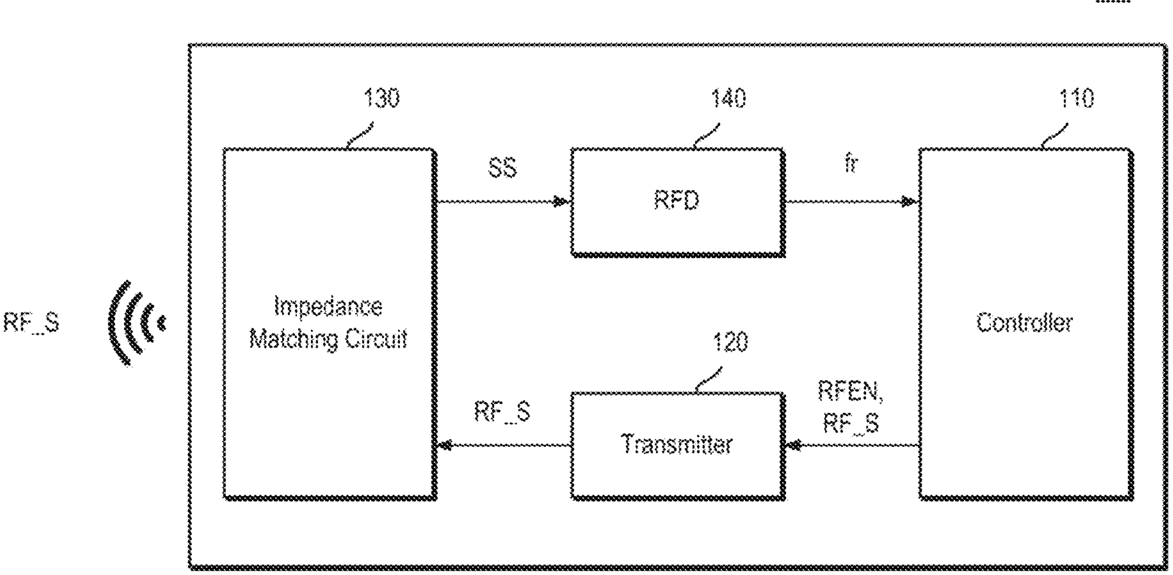
FIG. 1 is a diagram illustrating a short-range wireless communication device according to example embodiments.

FIG. 1 is a diagram illustrating a short-range wireless communication device according to example embodiments.

Referring to FIG. 1, a short-range wireless communication device 100 according to example embodiments may include a controller 110, a transmitter 120, an impedance matching circuit 130, and/or a resonant frequency detector (RFD) 140.

The controller 110 may control the overall operation of the short-range wireless communication device 100. The controller 110 may be connected to the transmitter 120 and may control the transmitter 120 through various control signals including an RF enable signal RFEN to output a radio-frequency (RF) signal.

In example embodiments, when the short-range wireless communication device 100 operates based on ALM, the controller 110 may perform the ALM based on the transmitter 120 during one or more unit periods, each including a single turn-on period and a single turn-off period. According to example embodiments, each of the one or more unit periods may correspond to a duration of time in which only one turn-on period and only one turn-off period occur in the performance of ALM. During the turn-on period, the controller 110 may control the transmitter 120 so as to output an RF signal RF_S by applying an RF enable signal RFEN, indicating an enable operation, to the transmitter 120. In the turn-off period, the controller 110 may control the transmitter 120 so as not to output the RF signal RF_S by applying an RF enable signal RFEN, indicating a disable operation, to the transmitter 120.

In the turn-on period, the amount of current flowing through the impedance matching circuit 130 may be increased, so that load impedance may be increased and a larger amount of energy may be transferred to an external device (e.g., the initiator). In the turn-off period, the load impedance may be reduced, so that the amount of the energy transferred to the external device (e.g., the initiator) may be reduced. The short-range wireless communication device 100 may modulate the load impedance while repeating the turn-on period and the turn-off period, and may transfer energy based on the modulation of the load impedance to the external device (e.g., the initiator).

The controller 110 may provide an RF signal RF_S to the transmitter 120, and the transmitter 120 may amplify the RF signal RF_S. For example, the RF signal RF_S may have an RF frequency of 13.56 MHz.

For example, the controller 110 may apply the RF enable signal RFEN to the transmitter 120 during the turn-on period. The transmitter 120 may be activated to operate based on the RF enable signal RFEN. The transmitter 120 may amplify the RF signal RF_S based on a control signal, received from the controller 110, other than the RF enable signal RFEN and may output the amplified RF signal RF_S to the impedance matching circuit 130.

The controller 110 may be connected to the resonant frequency detector 140 to receive information associated with a resonant frequency fr detected through the resonant frequency detector 140.

The transmitter 120 may amplify the RF signal RF_S provided from the controller 110, and may output the amplified RF signal RF_S to the impedance matching circuit 130. For example, the transmitter 120 may output the RF signal RF_S based on a reference clock signal having an RF frequency.

The transmitter 120 may be activated during the turn-on period or deactivated during the turn-off period based on the RF enable signal RFEN received from the controller 110. The transmitter 120 may operate so as to output the RF signal RF_S through the impedance matching circuit 130 during the turn-on period. The transmitter 120 may operate so as not to output the RF signal RF_S during the turn-off period.

The impedance matching circuit 130 may output the RF signal RF_S through the controller 110. In example embodiments, the impedance matching circuit 130 may output the RF signal RF_S having the RF frequency during the turn-on period. In example embodiments, during the turn-off period, the impedance matching circuit 130 may output a sensing signal SS having the resonant frequency fr based on induced electromotive force that is generated by the RF signal RF_S that was output during the turn-on period.

The sensing signal SS may be defined in terms of the resonant frequency detector 140 connected to the impedance matching circuit 130 to sensing a signal. According to example embodiments, the sensing signal SS may be received by the resonant frequency detector 140 from the impedance matching circuit 130 during both the turn-on period and the turn-off period. For example, the RF signal RF_S output during the turn-on period may also considered to be a type of sensing signal SS in terms of (e.g., from the perspective of) the resonant frequency detector 140. The sensing signal SS may have the RF frequency of the RF signal RF_S during the turn-on period, and may have the resonant frequency fr during the turn-off period.

The resonant frequency detector 140 may detect the resonant frequency fr of the impedance matching circuit 130 during the turn-off period.

In example embodiments, the resonant frequency detector 140 may sense the sensing signal SS from the impedance matching circuit 130 and may extract a recovered clock signal from the sensing signal SS. For example, the resonant frequency detector 140 may extract a recovered clock signal from a waveform of the sensing signal SS. The recovered clock signal may be a clock signal toggling according to vibration of a waveform of the sensing signal SS. For example, the recovered clock signal may oscillate according to the RF frequency during the turn-on period, and the recovered clock signal may oscillate according to the resonant frequency fr during the turn-off period. The resonant frequency detector 140 may detect a phase difference between the extracted recovered clock signal and a reference clock signal used to output the RF signal RF_S. The resonant frequency detector 140 may detect the resonant frequency fr of the impedance matching circuit 130 based on the detected phase difference. According to example embodiments, the resonant frequency detector 140 may provide the detected resonant frequency fr to the controller 110.

In example embodiments, the resonant frequency detector 140 may perform an operation according to the above-described examples for detecting the resonant frequency rf during a turn-off period included in a single unit period, among the one or more unit periods (e.g., among one or more periods, and may also be referred to herein as one or more first periods) in which the above-described ALM is performed. For example, the resonant frequency detector 140 may detect the resonant frequency rf only during a turn-off period within only a single unit period (e.g., a single turn-off period). According to example embodiments, each of the one or more unit periods includes only a single turn-on period and only a single turn-off period.

As described above, this is because the sensing signal SS sensed in the turn-off period vibrates at the resonant frequency fr based on the induced electromotive force generated in the impedance matching circuit 130 according to the RF signal RF_S in the turn-on period. For example, the phase difference between a recovered signal of the sensing signal SS vibrating at the resonant frequency fr during the turn-off period and a reference clock signal having a frequency (for example, an RF frequency) of an original signal may reflect characteristics of the resonant frequency rf. Accordingly, the resonant frequency detector 140 may detect the resonant frequency fr through the phase difference reflecting the characteristics of the resonant frequency fr.

According to the above-described examples, the short-range wireless communication device 100 may detect the resonant frequency fr through a turn-off period included in a single unit period in which ALM is performed. Accordingly, an amount of time used to detect the resonant frequency fr may be reduced to improve the degree of freedom in time for performing an operation of detecting the resonant frequency fr.

Figure 2:
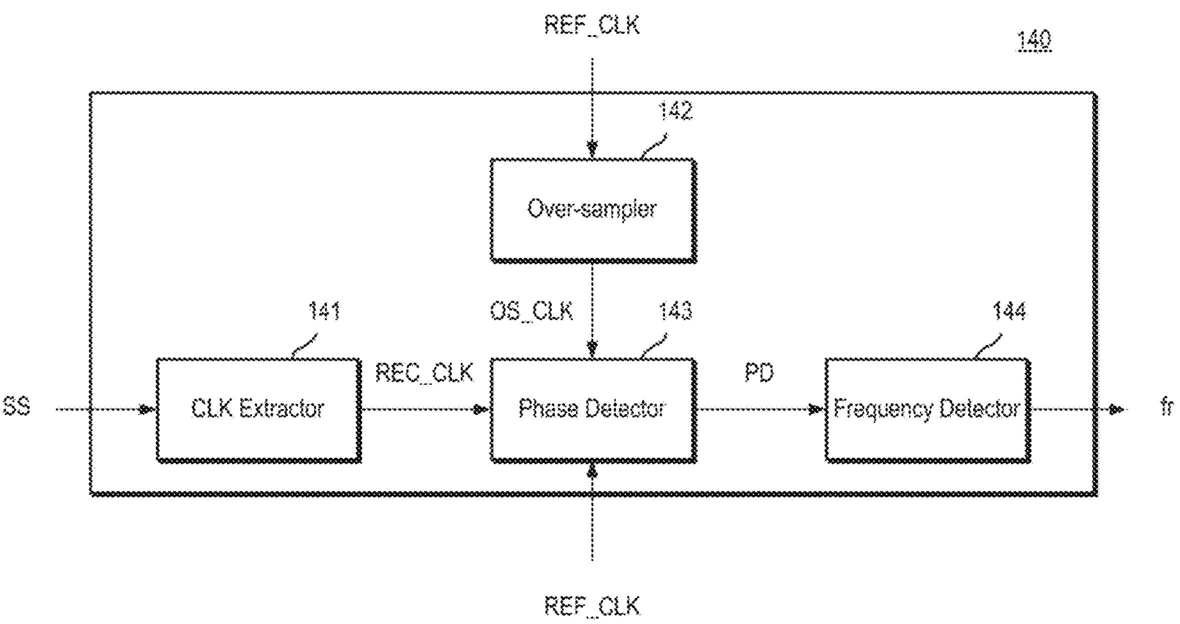
FIG. 2 is s diagram illustrating a resonant frequency detector according to example embodiments.

FIG. 2 is a diagram illustrating a resonant frequency detector according to example embodiments.

Referring to FIG. 2, a resonant frequency detector 140 according to example embodiments may include a clock extractor 141, an over-sampler 142, a phase detector 143, and/or a frequency detector 144.

The clock extractor 141 may receive a sensing signal SS from the impedance matching circuit 130 and may extract a recovered clock signal REC_CLK from the sensing signal SS. For example, the clock extractor 141 may extract a clock signal, toggling according to a waveform of the sensing signal SS, as the recovered clock signal REC_CLK.

The over-sampler 142 may receive a reference clock signal REF_CLK from the controller 110 and may over-sample the reference clock signal REF_CLK to generate an oversampling clock signal OS_CLK. For example, the over-sampler 142 may modulate a phase and/or a frequency of the reference clock signal REF_CLK to generate an oversampling clock signal OS_CLK having a frequency, higher than a frequency of the reference clock signal REF_CLK. For example, the frequency of the oversampling clock signal OS_CLK may be N times the frequency of the reference clock signal REF_CLK (where N is a positive integer). The oversampling clock signal OS_CLK may be used to extract edges of the recovery clock signal REC_CLK and the reference clock signal REF_CLK. According to example embodiments, the frequency of the oversampling clock signal OS_CLK may be selected according to a desired and/or useful sampling rate corresponding to an accuracy of the phase difference detection discussed further below. According to example embodiments, the frequency of the oversampling clock signal OS_CLK may be a design parameter determined through empirical study.

The phase detector 143 may extract an edge of the recovered clock signal REC_CLK and an edge of the reference clock signal REF_CLK based on the oversampling clock signal OS_CLK, and detect a difference between the edges as a phase difference. For example, the phase detector 143 may extract the edge of the recovery clock signal REC_CLK and the edge of the reference clock signal REF_CLK based on the edge of the oversampling clock signal OS_CLK, respectively. The phase detector 143 may detect a difference between the edge of the extracted recovered clock signal REC_CLK and the edge of the reference clock signal REF_CLK, as a phase difference. According to example embodiments, the phase detector 143 may receive the reference clock signal REF_CLK from the controller 110.

In example embodiments, the phase detector 143 may detect a difference between a single edge of the reference clock signal REF_CLK, and a single edge closest to a single edge, among a plurality of edges included in the recovered clock signal REC_CLK, in a time domain, as a phase difference. According to example embodiments, the phase detector 143 may detect a difference between a first single edge included in the reference clock signal REF_CLK and a second single edge included in the recovered clock signal REC_CLK as the phase difference. The second single edge may be closest in the time domain to the first single edge among a plurality of edges included in the recovered clock signal REC_CLK. The phase detector 143 may repeatedly perform detection of a difference between edges on all edges of the reference clock signal REF_CLK included in the turn-off period.

The frequency detector 144 may detect a resonant frequency fr based on the phase difference detected from the phase detector 143.

In example embodiments, the frequency detector 144 may calculate the resonant frequency fr from one or more phase differences detected during a turn-off period.

In example embodiments, the frequency detector 144 may calculate the resonant frequency rf based on a phase difference, detected in a period subsequent to a transient period in which the sensing signal SS searches the resonant frequency rf, among a plurality of phase differences detected in a turn-off period.

In example embodiments, the frequency detector 144 may detect the resonant frequency fr based on a mapping table in which a phase difference and the resonant frequency fr are mapped. In this case, the frequency detector 144 may include a memory, storing the mapping table, and a logic circuit extracting the resonant frequency fr corresponding to the phase difference from the mapping table.

The resonant frequency fr extracted according to the above-described examples may be used to address various challenges.

In example embodiments, the resonant frequency fr may be used to correct a distorted signal. A resonant frequency fr of the short-range wireless communication device 100 may have a distribution due to a characteristic error of each RF component, and may have a characteristic in which the quality of a signal is improved in a direction toward a center frequency and the signal is distorted in a direction away from the center frequency. Accordingly, a previously detected resonant frequency fr may be used to correct a distorted signal, and thus uniform communication performance may be secured even when the resonant frequency fr is changed. According to example embodiments, may correct distortion in a communication signal to be transmitted by the short-range wireless communication device 100 by using the resonant frequency fr to shift a frequency of the communication signal closer towards the center frequency.

In example embodiments, the resonant frequency fr may be provided to another short-range wireless communication device 100 communicating with the short-range wireless communication device 100. In this case, the resonant frequency fr may be used as a type of identification information. In this case, the transmitter 120 may transmit identification information including the resonant frequency fr. According to example embodiments, the identification information may be based on a characteristic error (e.g., a random or almost random error caused by, for example, a manufacturing process) of one or more RF components (e.g., one or more inductors and/or capacitors of a matching network).

Figure 3:
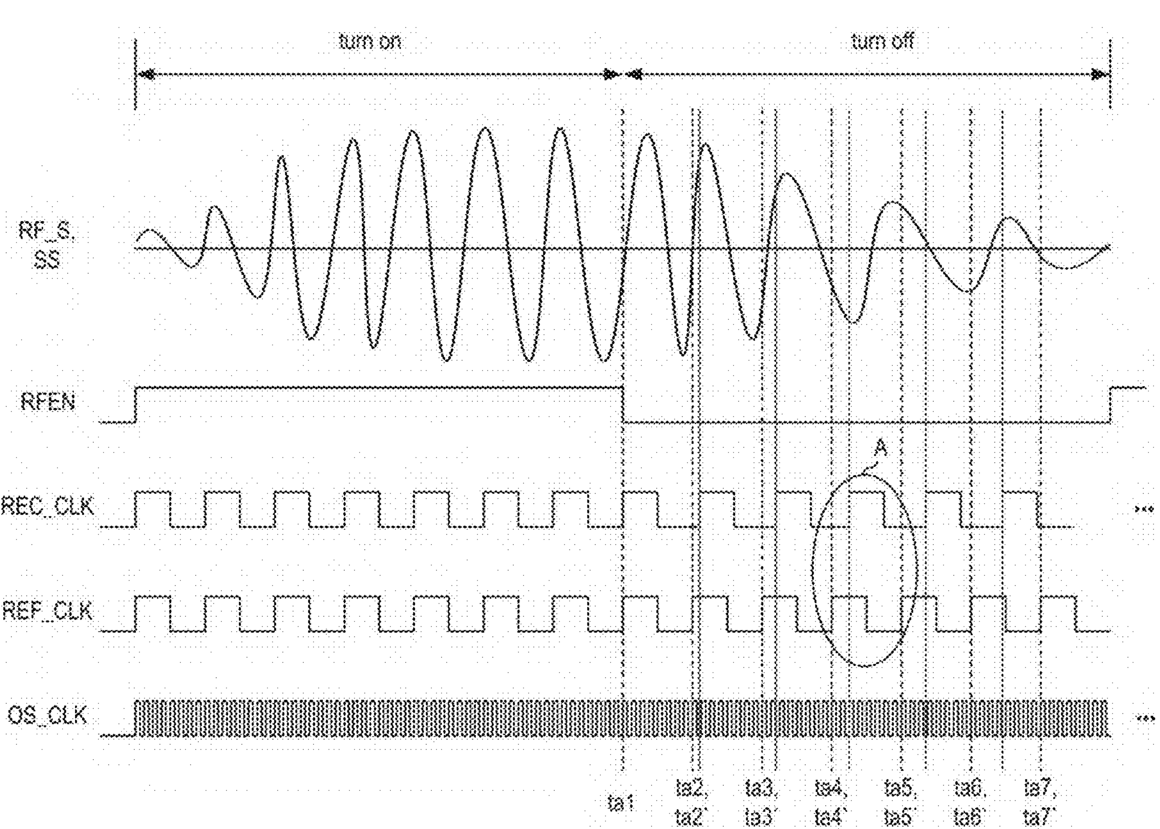
FIG. 3 is a diagram provided to describe an operation of a resonant frequency detector according to example embodiments in detail.

FIG. 3 is a diagram provided to describe an operation of a resonant frequency detector according to example embodiments in detail.

Referring to FIG. 3, the short-range wireless communication device 100 according to example embodiments may operate in a single unit period including a single turn-on period and a single turn-off period, as described above. In this case, the resonant frequency detector 140 may perform various operations of detecting, for example, a resonant frequency fr during the turn-off period.

In the turn-on period, the controller 110 may control the transmitter 120 and the impedance matching circuit 130 to output an RF signal RF_S through an RF enable signal RFEN. In the turn-on period in which the RF signal RF_S is output as the RF enable signal RFEN is turned on (for example, the RF enable signal RFEN has a logic high level), a reference clock signal REF_CLK and a recovered clock signal REC_CLK recovered through the RF signal RF_S may have the same phase (or similar phases). According to example embodiments, the resonant frequency detector 140 may perform an operation of generating an oversampling clock signal OS_CLK from the reference clock signal REF_CLK, from the turn-on period.

In the turn-on period, a signal sensed by the impedance matching circuit 130, for example, the RF signal RF_S may vibrate at an RF frequency.

Then, in the turn-off period, the controller 110 may turn off the RF enable signal RFEN (for example, having a logic low level) to control the transmitter 120 and the impedance matching circuit 130 so as not to output the RF signal RF_S any longer. The sensing signal SS sensed in the turn-off period may vibrate at the resonant frequency fr based on the induced electromotive force generated in the impedance matching circuit 130 by the RF signal RF_S during the turn-on period. In this case, unlike a fixed reference clock signal REF_CLK, the recovered clock signal REC_CLK recovered from the sensing signal SS may be changed in (e.g., different between) the turn-on period and the turn-off period. As a result, the recovery clock signal REC_CLK in the turn-off period may have a phase difference with the reference clock signal REF_CLK.

For example, as illustrated in the figure, when time points at which a rising edge appears in the reference clock signal REF_CLK during the turn-off period are defined as ta1 to ta7, a phase difference may occur between the rising edge of the reference clock signal REF_CLK and a rising edge of the recovered clock signal REC_CLK at the remaining time points other than the time point ta1 at which a turn-off period starts.

The rising edge of each of the recovered clock signal REC_CLK and the reference clock signal REF_CLK may correspond to one of a plurality of rising edges included in an oversampling signal oversampled to have a higher frequency. When time points at which the rising edge of the recovered clock signal REC_CLK starts are defined as ta1 and ta2' to ta7', the resonant frequency detector 140 may detect respective rising edges of the recovered clock signal REC_CLK corresponding to the time points ta2' to ta7' and respective rising edges of the reference clock signal REF_CLK based on an oversampled clock signal OS_CLK.

The resonant frequency detector 140 may detect a plurality of phase differences from an extracted difference between edges. The resonant frequency detector 140 may detect the resonant frequency fr using at least one of the plurality of phase differences. In example embodiments, the resonant frequency detector 140 may detect the resonant frequency rf based on a phase difference, corresponding to a period subsequent to a transient period (for example, a period in which a resonant frequency of the sensing signal SS corresponds to the resonant frequency rf), among the plurality of phase differences.

Figure 4:
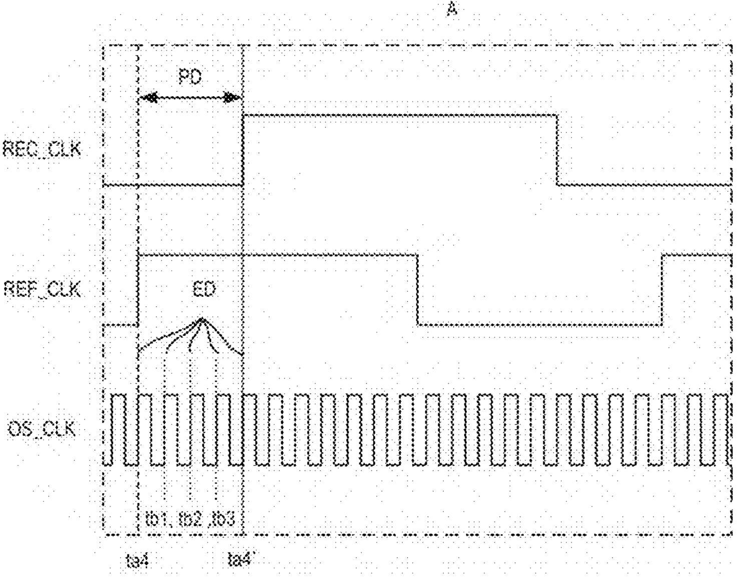
FIG. 4 is an enlarged view of area “A” of FIG. 3.

FIG. 4 is an enlarged view of area "A" of FIG. 3.

Referring to FIG. 4, for example, the rising edge of the reference clock signal REF_CLK and the rising edge of the recovered clock signal REC_CLK may correspond to ta4 and ta4' included in the area "A," respectively. The oversampling clock signal OS_CLK may include a plurality of pulses in a period from ta4 to ta4'. In this case, the resonant frequency detector 140 may compare a rising edge ED, corresponding to tb1 to tb3 of the plurality of pulses included in the oversampling clock signal OS_CLK, with each of the rising edges of the reference clock signal REF_CLK and the recovered clock signal REC_CLK. The resonant frequency detector 140 may extract rising edges, respectively corresponding to ta4 and ta4', among rising edges ED of the plurality of pulses and may detect a difference between the extracted edges as a phase difference PD.

Figure 5:
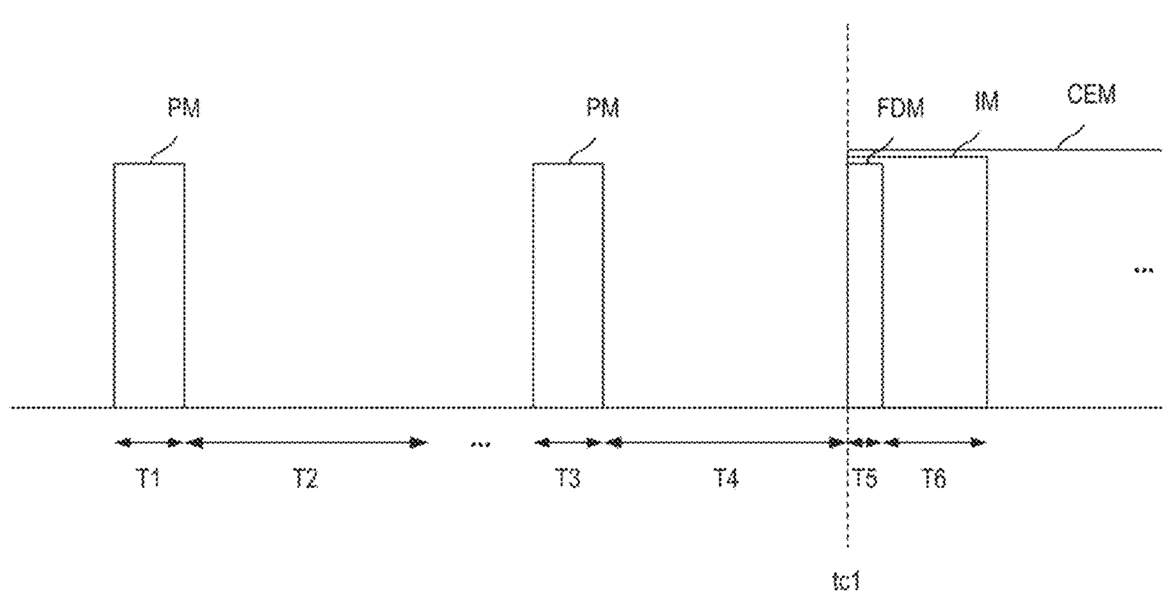
FIG. 5 is a diagram illustrating an example of an operation scenario of a short-range wireless communication device.

FIG. 5 is a diagram illustrating an example of an operation scenario of a short-range wireless communication device.

The short-range wireless communication device 100 may operate based on various operating scenarios. For example, as illustrated in FIG. 5, the short-range wireless communication device 100 may operate in a card emulation mode (CEM) when an approach of an initiator is detected (e.g., when an initiator is detected within a communication range of the short-range wireless communication device 100).

The short-range wireless communication device 100 may operate in a poll mode (PM) before operating in a card emulation mode (CEM). The poll mode (PM) may also be referred to as a low power sensing (LPS) mode or a standby mode. In the poll mode (PM), the short-range wireless communication device 100 may continuously detect (e.g., attempt to detect) another nearby short-range wireless communication device 100 but may operate with low power.

For example, in the poll mode (PM), the short-range wireless communication device 100 may generate an RF field through pulses each having a pulse width of hundreds of microseconds (μs), and may detect another nearby short-range wireless communication device 100 while continuously outputting the RF field.

The short-range wireless communication device 100 may output pulses in the poll mode (PM) and may operate in a listen mode to wait for a response for a predetermined (or alternatively, given) time. The short-range wireless communication device 100 may repeatedly perform the poll mode (PM) and the listen mode until an approach of another short-range wireless communication device 100 is detected. For example, the short-range wireless communication device 100 may repeatedly perform the poll mode (PM) and the listen mode during a period from T1 to T4, as illustrated in the drawing.

When the approach of another short-range wireless communication device 100 is detected in the listen mode, the short-range wireless communication device 100 may wake up and operate. The short-range wireless communication device 100 may wake up, and may then initiate communication with another short-range wireless communication device 100 (for example, an initiator). For example, when the approach of another short-range wireless communication device 100 is detected at a time point tc1, the short-range wireless communication device 100 may wake up. According to example embodiments, the short-range wireless communication device 100 may operate in the card emulation mode (CEM) based on (e.g., in response to) the detection of the other short-range wireless communication device 100.

In this case, in example embodiments, when the short-range wireless communication device 100 wakes up, the short-range wireless communication device 100 may operate first in a resonant frequency detection mode (FDM). In the resonant frequency detection mode (FDM), the short-range wireless communication device 100 may detect a resonant frequency fr according to the above-described various examples. For example, the short-range wireless communication device 100 may activate and deactivate the transmitter 120 through a turn-on period and a turn-off period during a period T5. The short-range wireless communication device 100 may detect the phase difference between a reference clock signal REF_CLK and a recovered clock signal REC_CLK during a turn-off period in which an RF signal RF_S is not output, and may detect the resonant frequency rf based on the detected phase difference.

For example, a period T5 (e.g., a first duration of time, also referred to herein as an operating time) in which the resonant frequency detection mode (FDM) is performed may be smaller than a period T1 or T3 (e.g., a second duration of time, also referred to herein as an operating time) in which the pole mode (PM) is performed.

When the resonant frequency fr is detected, the short-range wireless communication device 100 may operate in an initialization mode (IM) during a period T6. For example, when the short-range wireless communication device 100 operates in the card emulation mode (CEM), the initialization mode (IM) may include updating and/or booting firmware to operate in the card emulation mode (CEM).

When initialization is performed, the short-range wireless communication device 100 may operate in a card emulation mode (CEM). The short-range wireless communication device 100 may load-modulate data in response to a request from another short-range wireless communication device 100 according to the card emulation mode (CEM) operation, and may output the load-modulated data. According to example embodiments, the load-modulated data may be identification information including the resonant frequency fr. According to example embodiments, the load-modulated data (e.g., data identifying the short-range wireless communication device 100) may be output via a distortion-corrected signal, distortion having been removed from the distortion-corrected signal by the short-range wireless communication device 100 using the resonant frequency fr.

In example embodiments, for the above-described operations, the controller 110 may allow the short-range wireless communication device 100 to operate in the poll mode (PM) and the listen mode and may allow the short-range wireless communication device 100 to operate in the card emulation mode (CEM) when another short-range wireless communication device 100 is detected in the listen mode. Then, the resonant frequency detector 140 may detect the resonant frequency fr when the card emulation mode (CEM) starts (e.g., upon or in response to the start of the card emulation mode (CEM), and/or during the card emulation mode (CEM)).

According to the above-described examples, the short-range wireless communication device 100 may detect the resonant frequency fr based on the phase difference between the reference clock signal REF_CLK and the recovered clock signal REC_CLK, and thus may rapidly detect the resonant frequency rf with only a single unit period. Accordingly, the degree of freedom in time for the resonant frequency (fr) detection mode for detecting the resonant frequency fr may be secured. When a plurality of unit periods are used to detect the resonant frequency fr, there is an unavoidable limitation in detecting the resonant frequency fr in a scenario after waking up. On the other hand, the resonant frequency fr may be detected with only a single unit period according to example embodiments, so that not only the poll mode (PM) and the listen mode but also a resonant frequency (fr) mode may be performed even after waking up.

Figure 6:
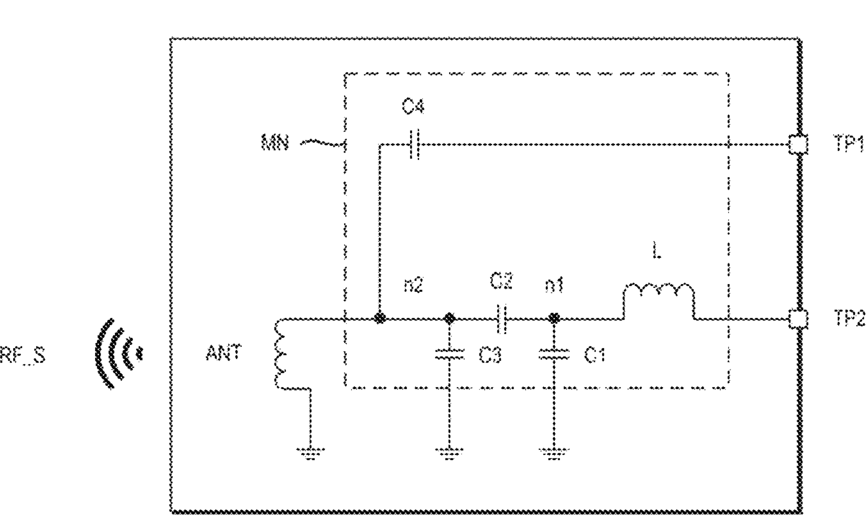
FIG. 6 is a diagram illustrating an impedance matching circuit according to example embodiments.

FIG. 6 is a diagram illustrating an impedance matching circuit according to example embodiments.

Referring to FIG. 6, the impedance matching circuit 130 according to example embodiments may include a matching network MN and/or an antenna ANT. The matching network MN and/or the antenna ANT may contribute to a resonant frequency fr of a sensing signal SS.

The matching network MN may provide impedance matching to the short range wireless communication device 100. The matching network MN may have one or more inductance components and/or one or more capacitance components. For example, as illustrated in the drawing, the matching network MN may include an inductor L and first to fourth capacitors C1 to C4. One end of the inductor L may be connected to a first node n1 and the other end thereof may be connected to a second transmission port TP2. One end of the first capacitor C1 may be connected to ground, and the other end thereof may be connected to the first node n1. One end of the second capacitor C2 may be connected to a second node n2 and the other end thereof may be connected to the first node n1. One end of the third capacitor C3 may be connected to ground, and the other end thereof may be connected to the second node n2. One end of the fourth capacitor C4 may be connected to the second node n2, and the other end thereof may be connected to the first transmission port TP1.

For example, the resonant frequency fr of the short-range wireless communication device 100 may be adjusted based on adjustment of the inductor L and at least one of the first to fourth capacitors C1 to C4.

The antenna ANT may have one or more inductance components. The antenna ANT may be connected to the matching network MN (e.g., between the second node n2 and ground). The antenna ANT may output an RF signal RF_S transmitted from the first transmission port TP1 and the second transmission port TP2 during a turn-on period. In a turn-off period, the sensing signal SS may be sensed from the antenna ANT.

The matching network MN and antenna ANT of FIG. 6 are merely examples, and may be configured in various forms for providing impedance matching.

Figure 7:
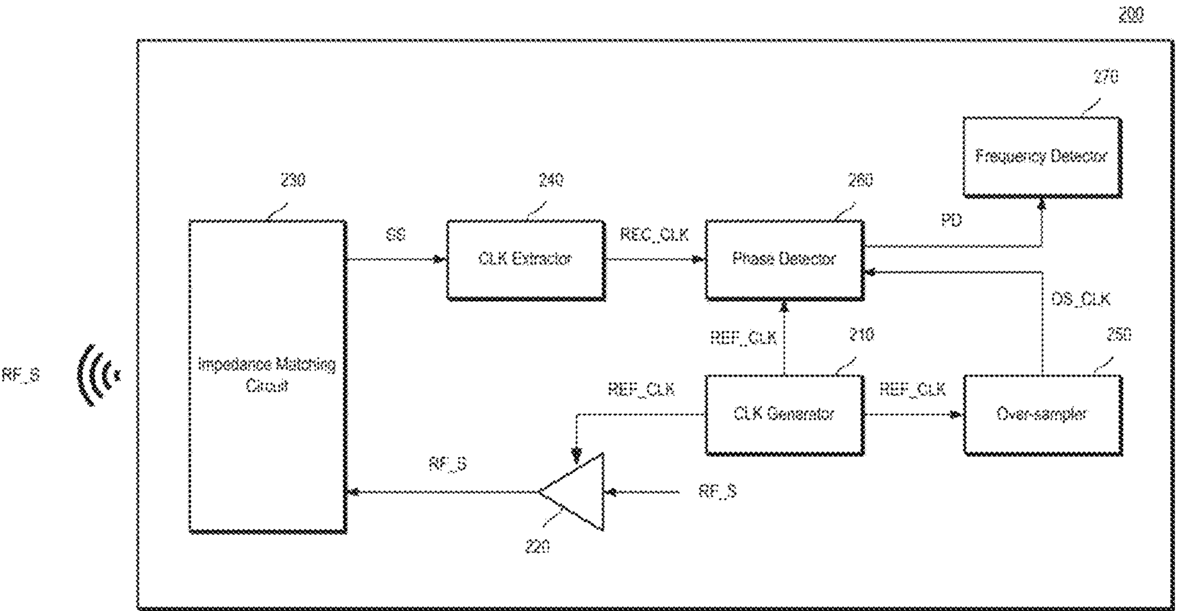
FIG. 7 is a diagram illustrating a short-range wireless communication device according to example embodiments.

FIG. 7 is a diagram illustrating a short-range wireless communication device according to example embodiments.

Referring to FIG. 7, a short-range wireless communication device 200 may include a clock generator 210, an amplifier 220, an impedance matching circuit 230, a clock extractor 240, an over-sampler 250, a phase detector 260, and/or a frequency detector 270. Hereinafter, detailed descriptions of parts overlapped with those described above will be omitted.

The clock generator 210 may generate a reference clock signal REF_CLK. For example, the clock generator 210 may generate a reference clock signal REF_CLK having a specific RF frequency and may output the generated reference clock signal REF_CLK to the amplifier 220.

The amplifier 220 may operate according to the reference clock signal REF_CLK. The amplifier 220 may receive and amplify the RF signal RF_S (e.g., receive from the controller 110 and/or the transmitter 120), and may output the amplified RF signal RF_S to the impedance matching circuit 230. The amplifier 220 may output the RF signal RF_S during a turn-on period and may be deactivated during the turn-off period.

The impedance matching circuit 230 may output the RF signal RF_S during a turn-on period.

The clock extractor 240 may receive a sensing signal SS sensed by the impedance matching circuit 230 during a turn-off period and may extract a recovered clock signal REC_CLK based on the sensing signal SS. The clock extractor 240 may transmit the recovered clock signal REC_CLK to the phase detector 260.

The over-sampler 250 may oversample the reference clock signal REF_CLK, generated by the clock generator 210, to generate an oversampling clock signal OS_CLK. The over-sampler 250 may transmit the oversampling clock signal OS_CLK to the phase detector 260.

The phase detector 260 may detect a phase difference PD between the recovered clock signal REC_CLK and the reference clock signal REF_CLK based on the received recovered clock signal REC_CLK and the oversampling clock signal OS_CLK. The phase detector 260 may transmit the detected phase difference PD to the frequency detector 270.

The frequency detector 270 may detect the resonant frequency fr based on the phase difference PD. When the short-range wireless communication device 200 operates in a resonant frequency (fr) detection mode, the frequency detector 270 may detect the resonant frequency rf based on the phase difference PD even if the amplifier 220 operates during only a single unit period including a single turn-on period and a single turn-off period.

Figure 8:
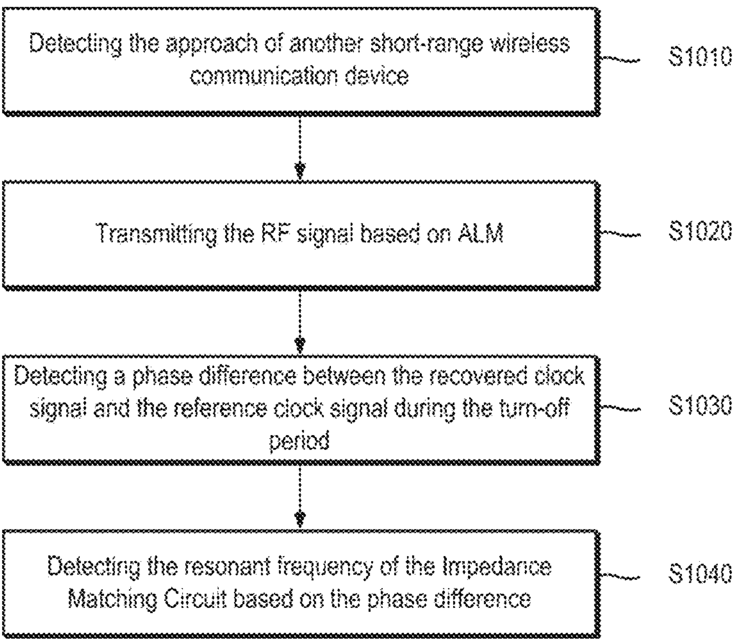
FIG. 8 is a flowchart illustrating a method of operating a short-range wireless communication device according to example embodiments.

FIG. 8 is a flowchart illustrating a method of operating a short-range wireless communication device according to example embodiments.

Referring to FIG. 8, in example embodiments, in operation S1010, the short-range wireless communication device 100 and/or 200 may detect an approach of another short-range wireless communication device. For example, the short-range wireless communication device 100 and/or 200 may detect the approach of another short-range wireless communication device while repeatedly performing the above-described poll mode (PM) and listen mode during operation S1010.

In operation S1020, the short-range wireless communication device 100 and/or 200 may transmit an RF signal RF_S based on ALM. When the approach of another short-range wireless communication device is detected through operation S1010, the short-range wireless communication device 100 and/or 200 may wake up and operate in a resonant frequency (fr) mode during a single unit period. The short-range wireless communication device 100 and/or 200 may transmit an RF signal RF_S based on the ALM during a turn-on period through operation S1020 while operating in a resonant frequency (rf) mode. Also, the short-range wireless communication device 100 and/or 200 may stop transmission of the RF signal RF_S during a turn-off period subsequent to the turn-on period.

In operation S1030, the short-range wireless communication device 100 and/or 200 may detect a phase difference between the recovered clock signal REC_CLK and the reference clock signal REF_CLK during the turn-off period. During the turn-off period, the reference clock signal REF_CLK may be maintained while the recovered clock signal REC_CLK may gradually oscillate according to the resonant frequency fr, resulting in a phase difference therebetween. The short-range wireless communication device 100 and/or 200 may detect the phase difference occurring during the turn-off period.

In operation S1040, the short-range wireless communication device 100 and/or 200 may detect the resonant frequency fr of the impedance matching circuit 130 based on the detected phase difference.

Figure 9:
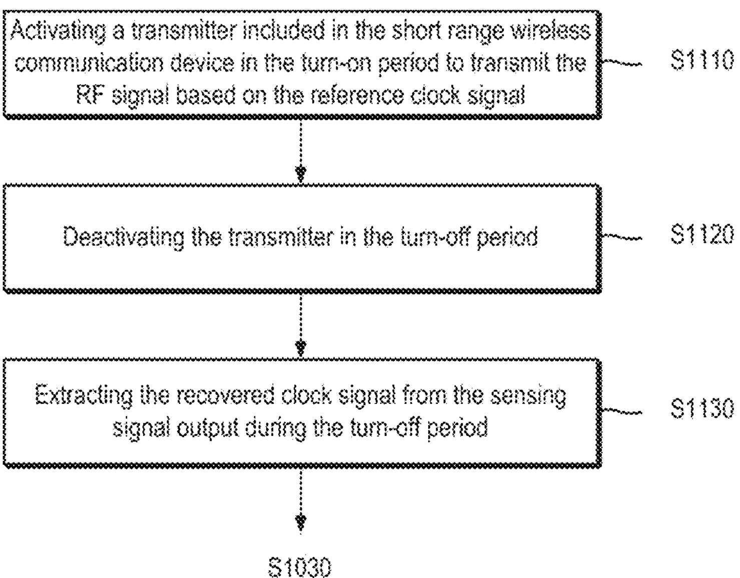
FIG. 9 is a flowchart illustrating a method of detecting a resonant frequency of a short-range wireless communication device according to example embodiments.

FIG. 9 is a flowchart illustrating a method of detecting a resonant frequency of a short-range wireless communication device according to example embodiments.

Referring to FIG. 9, in operation S1110, the short-range wireless communication device 100 and/or 200 may activate the transmitter 120, included in the short-range wireless communication device 100 and/or 200, in a turn-on period to transmit an RF signal RF_S based on a reference clock signal REF_CLK.

In operation S1120, the short-range wireless communication device 100 and/or 200 may deactivate the transmitter 120 in a turn-off period. In the turn-off period, a sensing signal SS output through the impedance matching circuit 130 may vibrate at a resonant frequency fr based on induced electromotive force generated according to the RF signal RF_S output during the turn-on period. According to example embodiments, the operations S1110 and/or S1120 may correspond to operation S1020 discussed in association with FIG. 8.

In operation S1130, the short-range wireless communication device 100 and/or 200 may extract the recovered clock signal REC_CLK from the sensing signal SS output during the turn-off period. For example, the recovered clock signal REC_CLK extracted during the turn-off period may have the same frequency as (or a similar frequency to) the resonant frequency fr.

Then, the short-range wireless communication device 100 and/or 200 may perform operation S1030 in which a phase difference is detected based on the extracted recovered clock signal REC_CLK.

Figure 10:
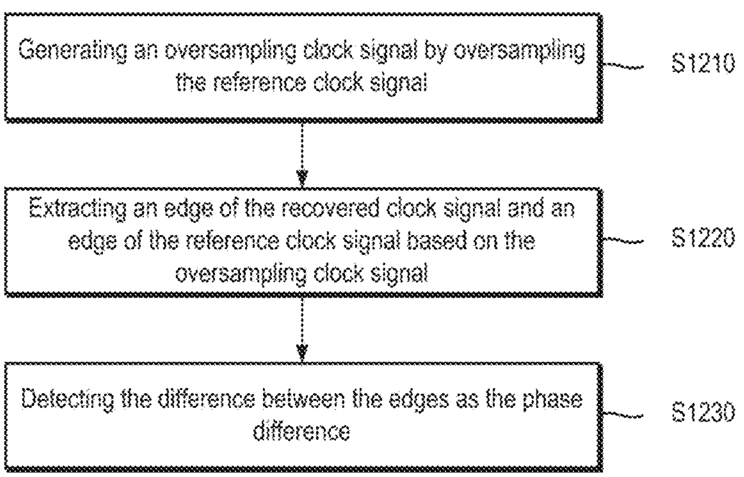
FIG. 10 is a flowchart illustrating a method of detecting a phase difference of a short-range wireless communication device according to example embodiments.

FIG. 10 is a flowchart illustrating a method of detecting a phase difference of a short-range wireless communication device according to example embodiments. According to example embodiments, the operations of FIG. 10 may correspond to those of operation S1030 discussed in connection with FIG. 8.

Referring to FIG. 10, in operation S1210, the short-range wireless communication device 100 and/or 200 may oversample a reference clock signal REF_CLK to generate an oversampling clock signal OS_CLK.

In operation S1220, the short-range wireless communication device 100 and/or 200 may extract an edge of a recovered clock signal REC_CLK and an edge of the reference clock signal REF_CLK based on the oversampling clock signal OS_CLK. For example, among rising edges of the oversampling clock signal OS_CLK, the short-range wireless communication device 100 and/or 200 may extract rising edges, respectively corresponding to a rising edge of the recovered block signal REC_CLK and a rising edge of the reference clock signal REF_CLK, among rising edges of the oversampling clock signal OS_CLK. For example, the short-range wireless communication device 100 and/or 200 may repeatedly perform operation S1220 on all edges of the recovered clock signal REC_CLK and the reference clock signal REF_CLK included in a turn-off period.

In operation S1230, the short-range wireless communication device 100 and/or 200 may detect a difference between the edges, as a phase difference. For example, the short-range wireless communication device 100 and/or 200 may detect a difference between a single edge, among edges of the reference clock signal REF_CLK, and an edge of the recovered clock signal REC_CLK closest to the single edge in a time domain, as a phase difference. For example, the short-range wireless communication device 100 and/or 200 may repeatedly perform operation S1230 on all edges of the recovered clock signal REC_CLK and the reference clock signal REF_CLK included in the turn-off period. In example embodiments, the short-range wireless communication device 100 and/or 200 may further perform an operation of extracting a phase difference, detected in a period subsequent to a transition period, from among a plurality of phase differences detected in operation S1230, and may calculate a resonant frequency rf based on the extracted phase difference.

FIG. 11 is a flowchart illustrating a method of operating a short-range wireless communication device according to example embodiments.

Referring to FIG. 11, in operation S1310, the short-range wireless communication device 100 and/or 200 may alternately operate in a poll mode (PM) and a listen mode.

In operation S1320, the short-range wireless communication device 100 and/or 200 may detect (e.g., attempt to detect) one or more other short-range wireless communication devices in a listen mode. In operation S1330, the short-range wireless communication device 100 and/or 200 may determine whether the detection is successful (e.g., whether another short-range wireless communication device has been detected).

When it is determined that the detection is successful in operation S1330, the short-range wireless communication device 100 and/or 200 may operate in a card emulation mode in operation S1340. Alternatively, when it is determined that the detection fails in operation S1330, the short-range wireless communication device 100 and/or 200 may detect an approach of another short-range wireless communication device again (e.g., repeat an attempt to detect one or more other short-range wireless communication devices) from operation S1310.

In operation S1350, the short-range wireless communication device 100 and/or 200 may operate in a resonant frequency (fr) detection mode when the card emulation mode starts. In operation S1350, the short-range wireless communication device 100 and/or 200 may transmit an RF signal RF_S based on a reference clock signal REF_CLK in a turn-on period, may extract a recovered clock signal REC_CLK from the sensing signal SS output in a turn-off period, may detect a phase difference between the recovered clock signal REC_CLK and the reference clock signal REF_CLK, and may detect a resonant frequency rf of the short-range wireless communication device based on the phase difference, according to the above-described examples. According to example embodiments, operation S1350 may correspond to operations S1020, S1030 and/or S1040 discussed in connection with FIG. 8.

FIG. 12 is a diagram illustrating a short-range wireless communication system according to example embodiments.

Referring to FIG. 12, a short-range wireless communication system may include a first short-range wireless communication device 1000 and a second short-range wireless communication device 2000. Each of the first short-range wireless communication device 1000 and the second short-range wireless communication device 2000 may operate in a reader mode or a card emulation mode.

For example, when the first short-range wireless communication device 1000 operates in a reader mode, the first short-range wireless communication device 1000 may transmit a first signal, an RF field, to the second short-range wireless communication device 2000 through electromagnetic guided waves. The first signal may include a continuous wave for transferring power and a first information signal added to the continuous wave to transmit information.

The second short-range wireless communication device 2000 may operate in the card emulation mode. The second short-range wireless communication device 2000 may obtain power from the continuous wave of the first signal. The second short-range wireless communication device 2000 may obtain information from the first information signal of the first signal. The second short-range wireless communication device 2000 may add a second information signal for transmitting information to the continuous wave of the first signal, and may transmit a result of the addition to the first short-range wireless communication device 1000. For example, the second short-range wireless communication device 2000 may transmit a unique identifier, stored data, or other information as a second information signal. For example, the short-range wireless communication device may transmit the second signal to the first short-range wireless communication device 1000 through electromagnetic induction.

Alternatively, the second short-range wireless communication device 2000 may include an internal power supply. In this case, the second short-range wireless communication device 2000 may actively add the second information signal to the continuous wave of the first signal using internal power of a target, and may transmit a result of the addition to the first short-range wireless communication device 1000.

For example, the second short-range wireless communication device 2000 may transmit the second information signal based on ALM. In this case, the second short-range wireless communication device 2000 may detect the resonant frequency fr according to the above-described examples while operating in the card emulation mode.

Figure 13:
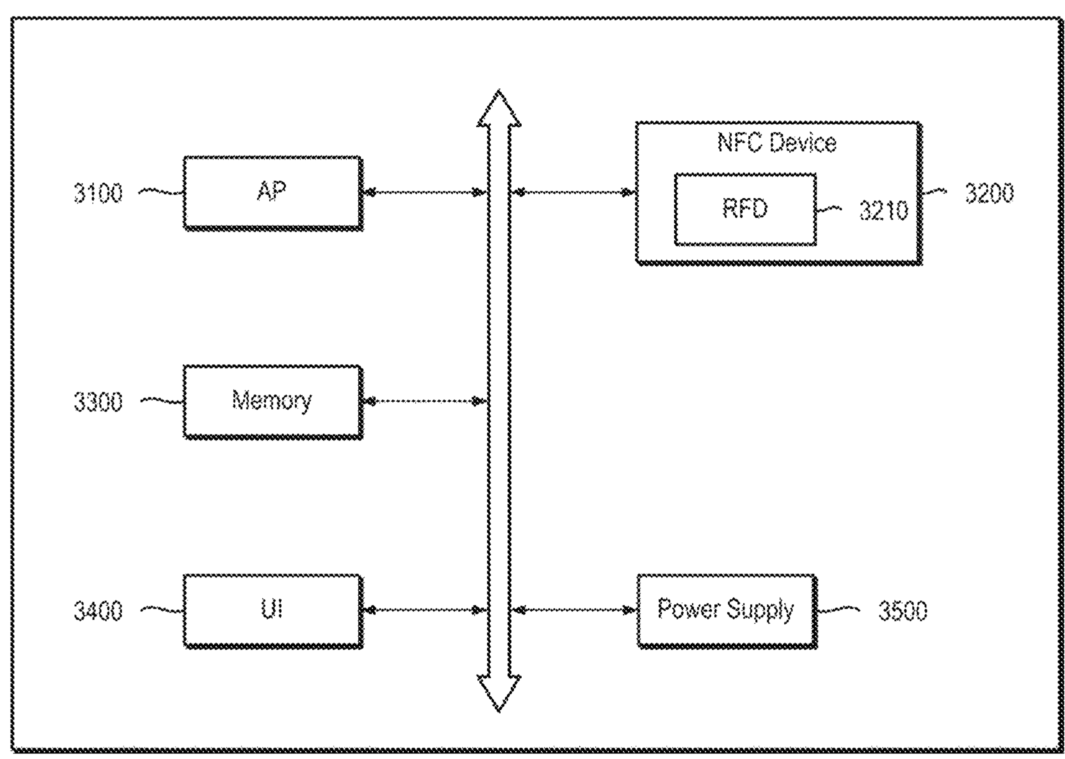
FIG. 13 is a diagram illustrating an electronic device according to example embodiments.

FIG. 13 is a diagram illustrating an electronic device according to example embodiments.

Referring to FIG. 13, an electronic device 3000 may include an application processor (AP) 3100, a short-range wireless communication device 3200, a memory 3300, a user interface (UI) 3400, and/or power supply 3500.

The application processor 3100 may control the overall operation of the electronic device 3000. The short-range wireless communication device 3200 may transmit data, stored in the memory 3300, to an external device through short-range wireless communication or may store data, received from the external device, in the memory 3300. The short-range wireless communication device 3200 may include a resonant frequency detector 3210, and the resonant frequency detector 3210 may detect a resonant frequency fr in a turn-off period according to the above-described examples.

The memory 3300 may store data used for operations of the electronic device 3000, transmission/receipt data, and/or various types of other data. In example embodiments, the memory 3300 may store a phase difference detected through the short-range wireless communication device 3200, a resonant frequency fr, a mapping table, and/or the like.

The user interface 3400 may include one or more input devices, such as a keypad or a touchscreen, and/or one or more output devices such as a speaker or a display device. The power supply 3500 may supply operating power of the electronic device 3000.

As described above, a short-range wireless communication device providing a resonant frequency detection function, allowing time used for detection to be significantly reduced, and a method of operating the same may be provided.

Conventional devices and methods for short-range wireless communication determine a resonant frequency by timing a period of the resonant frequency over a plurality of turn-off periods, and accumulating (e.g., combining) the results. Since the conventional devices and methods rely on timing information of a plurality of turn-off periods (and unit periods) to determine the resonant frequency, the conventional devices and methods experience excessive delay in determining the resonant frequency. In scenarios in which the resonant frequency is used to remove distortion from a communication signal, this delay also results in insufficient communication quality.

However, according to example embodiments, improved devices and methods are provided for short-range wireless communication. For example, the improved devices and methods may determine a resonant frequency by detecting a phase difference between a recovered clock signal and a reference clock signal. Through this approach, the improved devices and methods determine the resonant frequency in only a single turn-off period (of a only a single unit period). Accordingly, the improved devices and methods overcome the deficiencies of the conventional devices and methods to at least reduce delay in determining the resonant frequency. Also, in scenarios in which the resonant frequency is used to remove distortion from a communication signal, the improved devices and methods may improve communication quality by removing the distortion from the communication signal faster than would be achieved according to the conventional devices and methods.

According to example embodiments, operations described herein as being performed by the short-range wireless communication device 100, the controller 110, the transmitter 120, the impedance matching circuit 130, the resonant frequency detector 140, the clock extractor 141, the over-sampler 142, the phase detector 143, the frequency detector 144, the short-range wireless communication device 200, the clock generator 210, the amplifier 220, the impedance matching circuit 230, the clock extractor 240, the over-sampler 250, the phase detector 260, the frequency detector 270, the first short-range wireless communication device 1000, the second short-range wireless communication device 2000, the electronic device 3000, the AP 3100, the short-range wireless communication device 3200, the user interface (UI) 3400, and/or the resonant frequency detector 3210 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with example embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium (e.g., the memory 3300). A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

While example embodiments have been shown and described above, it will be apparent to those skilled in the art that modifications and variations could be made without departing from the scope of the present inventive concepts as defined by the appended claims.

What is claimed is:

1. A short-range wireless communication device comprising:

an impedance matching circuit configured to, output a radio frequency (RF) signal in a turn-on period, the RF signal being based on a reference clock signal, and output a sensing signal in a turn-off period; and processing circuitry configured to, extract a recovered clock signal from the sensing signal, detect a phase difference between the recovered clock signal and the reference clock signal, and detect a resonant frequency of the impedance matching circuit based on the phase difference.

2. The short-range wireless communication device of claim 1, wherein a frequency of the sensing signal is the same as a frequency of the RF signal during the turn-on period; and the frequency of the sensing signal is the resonant frequency during the turn-off period.

3. The short-range wireless communication device of claim 1, wherein the processing circuitry is configured to perform active load modulation (ALM) during one or more first periods, each of the one or more first periods includes a single turn-on period and a single turn-off period.

4. The short-range wireless communication device of claim 3, wherein the processing circuitry is configured to detect the resonant frequency during the single turn-off period included in a single first period, the single first period being among the one or more first periods.

5. The short-range wireless communication device of claim 1, wherein the processing circuitry is configured to:

oversample the reference clock signal to generate an oversampling clock signal, extract an edge of the recovered clock signal and an edge of the reference clock signal based on the oversampling clock signal, and detect a difference between the edge of the recovered clock signal and the edge of the reference clock signal as the phase difference.

6. The short-range wireless communication device of claim 1, wherein the processing circuitry is configured to:

cause the short-range wireless communication device to operate alternately in a poll mode and a listen mode;

cause the short-range wireless communication device to operate in a card emulation mode based on another short-range wireless communication device being detected in the listen mode; and detect the resonant frequency when the card emulation mode starts.

7. The short-range wireless communication device of claim 1, wherein the processing circuitry is configured to:

receive the sensing signal from the impedance matching circuit;

oversample the reference clock signal to generate an oversampling clock signal;

extract an edge of the recovered clock signal and an edge of the reference clock signal based on the oversampling clock signal; and detect a difference between the edge of the recovered clock signal and the edge of the reference clock signal as the phase difference.

8. The short-range wireless communication device of claim 1, wherein the processing circuitry is configured to repeatedly performs an operation of detecting a difference between a first single edge included in the reference clock signal and a second single edge included in the recovered clock signal as the phase difference, the second single edge being closest in a time domain to the first single edge among a plurality of edges included in the recovered clock signal.

9. The short-range wireless communication device of claim 1, wherein the processing circuitry is configured to transmit identification information comprising the resonant frequency.

10. The short-range wireless communication device of claim 1, wherein the processing circuitry is configured to detect the resonant frequency based on a mapping table, the mapping table mapping the phase difference to the resonant frequency.

11. A method of operating a short-range wireless communication device, the method comprising:

transmitting a radio frequency (RF) signal in a turn-on period, the RF signal being based on a reference clock signal;

extracting a recovered clock signal from a sensing signal output in a turn-off period;

detecting a phase difference between the recovered clock signal and the reference clock signal; and detecting a resonant frequency of the short-range wireless communication device based on the phase difference.

12. The method of claim 11, wherein a frequency of the sensing signal is the same as the RF signal during the turn-on period; and the frequency of the sensing signal is the resonant frequency during the turn-off period.

13. The method of claim 11, further comprising:

performing active load modulation (ALM) during one or more first periods, each of the one or more first periods including a single turn-on period and a single turn-off period, wherein the detecting the resonant frequency comprises detecting the resonant frequency during the turn-off period included in a single first period among the one or more first periods.

14. The method of claim 11, wherein the detecting the phase difference comprises:

oversampling the reference clock signal to generate an oversampling clock signal;

extracting an edge of the recovered clock signal and an edge of the reference clock signal based on the oversampling clock signal; and detecting a difference between the edge of the recovered clock signal and the edge of the reference clock signal as the phase difference.

15. The method of claim 11, further comprising:

transmitting identification information comprising the resonant frequency.

16. A method of operating a short-range wireless communication device, the method comprising:

operating alternately in a poll mode and a listen mode;

detecting another short-range wireless communication device in the listen mode;

operating in a card emulation mode based on the other short-range wireless communication device detecting; and operating in a resonant frequency detection mode when the card emulation mode starts.

17. The method of claim 16, wherein the operating in the resonant frequency detection mode comprises:

transmitting a radio frequency (RF) signal in a turn-on period, the RF signal being based on a reference clock signal;

extracting a recovered clock signal from a sensing signal output in a turn-off period;

detecting a phase difference between the recovered clock signal and the reference clock signal; and detecting a resonant frequency of the short-range wireless communication device based on the phase difference.

18. The method of claim 16, wherein an operating time of the resonant frequency detection mode is smaller than an operating time of the poll mode.

19. The method of claim 16, further comprising:

transmitting identification information comprising a resonant frequency after initiation of the operating in the card emulation mode.

20. The method of claim 17, wherein a frequency of the sensing signal is the same as a frequency of the RF signal during the turn-on period; and the frequency of the sensing signal is the resonant frequency during the turn-off period.

* * * * *